United States Patent
Feustel et al.

(10) Patent No.: US 8,323,989 B2
(45) Date of Patent: Dec. 4, 2012

(54) TEST SYSTEM AND METHOD OF REDUCING DAMAGE IN SEED LAYERS IN METALLIZATION SYSTEMS OF SEMICONDUCTOR DEVICES

(75) Inventors: Frank Feustel, Dresden (DE); Tobias Letz, Dresden (DE); Frank Koschinsky, Radebeul (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 207 days.

(21) Appl. No.: 12/749,805

(22) Filed: Mar. 30, 2010

(65) Prior Publication Data

US 2010/0244028 A1    Sep. 30, 2010

(30) Foreign Application Priority Data

Mar. 31, 2009   (DE) .......................... 10 2009 015 718

(51) Int. Cl.
*H01L 21/66* (2006.01)
*H01L 23/58* (2006.01)
(52) U.S. Cl. .................... 438/14; 257/48; 257/E21.521; 257/E23.179
(58) Field of Classification Search .............. 257/48; 438/14, 15, 16, 17, 18
See application file for complete search history.

(56) References Cited

U.S. PATENT DOCUMENTS

| | | | |
|---|---|---|---|
| 2005/0214956 A1* | 9/2005 | Li et al. ........................... | 438/14 |
| 2006/0088949 A1 | 4/2006 | Smayling et al. ............... | 438/14 |
| 2006/0118968 A1* | 6/2006 | Johnston et al. ............... | 257/775 |
| 2007/0166995 A1 | 7/2007 | Malhotra et al. ............... | 438/618 |

FOREIGN PATENT DOCUMENTS

WO    WO 03/023848 A2    3/2003

OTHER PUBLICATIONS

Kim et al., "Direct Plating of Low Resistivity Bright Cu Film onto TiN Barrier Layer via Pd Activation," *Journal of the Electrochemical Society*, 151:C97-C101, 2004.
Translation of Official Communication from German Patent Office for German Patent Application No. 10 2009 015 718.2 dated Oct. 30, 2009.

* cited by examiner

*Primary Examiner* — Ha Tran T Nguyen
*Assistant Examiner* — Kevin Quinto
(74) *Attorney, Agent, or Firm* — Williams, Morgan & Amerson

(57) ABSTRACT

During the formation of a complex metallization system, the influence of a manufacturing environment on sensitive barrier/seed material systems may be monitored or controlled by using an appropriate test pattern and applying an appropriate test strategy. For example, actual probe and reference substrates may be prepared and may be processed with and without exposure to the manufacturing environment of interest, thereby enabling an efficient evaluation of one or more parameters of the environment. Furthermore, an "optimized" manufacturing environment may be obtained on the basis of the test strategy disclosed herein.

15 Claims, 9 Drawing Sheets

TEST SYSTEM AND METHOD OF REDUCING DAMAGE IN SEED LAYERS IN METALLIZATION SYSTEMS OF SEMICONDUCTOR DEVICES

BACKGROUND OF THE INVENTION

1. Field of the Invention

The present disclosure generally relates to the field of integrated circuits, and, more particularly, to the manufacture of an interconnect structure requiring a sophisticated barrier and/or seed layer formed between a bulk metal and a dielectric.

2. Description of the Related Art

In a complex integrated circuit, a very large number of circuit elements, such as transistors, capacitors, resistors and the like, are formed in or on an appropriate substrate, usually in a substantially planar configuration. Due to the large number of circuit elements and the required complex layout of the integrated circuits, generally, the electrical connection of the individual circuit elements may not be established within the same level on which the circuit elements are manufactured, but one or more additional "wiring" layers are required, also referred to as metallization layers. These metallization layers generally include metal lines, providing the inner-level electrical connection, and also include a plurality of inter-level connections, also referred to as vias, wherein the metal lines and vias may also be commonly referred to as interconnect structures.

Due to the continuous shrinkage of the feature sizes of circuit elements in modern integrated circuits, the number of circuit elements for a given chip area, that is the packing density, also increases, thereby also requiring an increase in the number of electrical inter-connections to provide the desired circuit functionality. Therefore, the number of stacked metallization layers typically increases as the number of circuit elements per chip area becomes larger. Since the fabrication of a plurality of metallization layers entails extremely challenging issues to be solved, such as mechanical, thermal and electrical reliability of many stacked metallization layers that are required, for example, for sophisticated microprocessors, semiconductor manufacturers are increasingly using a metal that allows high current densities and reduced dimensions of the interconnections. For example, copper is a metal generally considered to be a viable candidate due to its superior characteristics in view of higher resistance against electromigration and significantly lower electrical resistivity when compared with other metals, such as aluminum, that have been used over the last decades. In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures due to its lack of forming volatile etch byproducts. In manufacturing metallization layers including copper, the so-called damascene technique is therefore preferably used, wherein a dielectric layer is first applied and then patterned to receive trenches and/or vias, which are subsequently filled with copper. A further major drawback of copper is its property to readily diffuse in low-k dielectric materials, silicon and silicon dioxide, and other well-established and approved dielectric materials in fabricating integrated circuits.

It is, therefore, necessary to employ a so-called barrier material in combination with a copper-based metallization to substantially avoid any out-diffusion of copper into the surrounding dielectric material, as copper may readily migrate to sensitive semiconductor areas, thereby significantly changing the characteristics thereof. On the other hand, the barrier material may suppress the diffusion of reactive components into the metal region. The barrier material provided between the copper and the dielectric material should exhibit, however, in addition to the required barrier characteristics, good adhesion to the dielectric material as well as to the copper and should also have as low an electrical resistance as possible so as to not unduly compromise the electrical properties of the interconnect structure. Moreover, the barrier layer may also act as a "template" for the subsequent deposition of the copper material in view of generating a desired crystalline configuration, since a certain degree of information of the texture of the barrier layer may be transferred into the copper material to obtain a desired grain size and configuration. It turns out, however, that a single material may not readily meet the requirements imposed on a desired barrier material. Hence, a mixture of materials may be frequently used to provide the desired barrier characteristics. For instance, a bi-layer comprised of tantalum and tantalum nitride is often used as a barrier material in combination with a copper damascene metallization layer. Tantalum, which effectively blocks copper atoms from diffusing into an adjacent material even when provided with an extremely thin layer thickness, however, exhibits only a poor adhesion to a plurality of dielectric materials, such as silicon dioxide based dielectrics, so that a copper interconnection including a tantalum barrier layer may suffer from reduced mechanical stability, especially during the chemical mechanical polishing of the metallization layer, which may be employed for removing excess copper and planarizing the surface for the provision of a further metallization layer. The reduced mechanical stability during the CMP process may, however, entail severe reliability concerns in view of reduced thermal and electrical conductivity of the interconnections. On the other hand, tantalum nitride exhibits excellent adhesion to silicon dioxide based dielectrics, but has very poor adhesion to copper. Consequently, in advanced integrated circuits having a copper-based metallization, typically, a barrier bi-layer of tantalum nitride/tantalum is used. The demand for a low resistance of the interconnect structure in combination with the continuous reduction of the dimensions of the circuit elements and associated therewith of the metal lines and vias the thickness of the barrier layer has to be reduced, while nevertheless providing the required barrier effect. It has been recognized that tantalum nitride provides excellent barrier characteristics even if applied with a thickness of only a few nanometers and even less. Thus, sophisticated deposition techniques have been developed for forming thin tantalum nitride layers with high conformality even in high aspect ratio openings, such as the vias of advanced metallization structures, wherein the desired surface texture with respect to the further processing may also be obtained.

Since the dimensions of the trenches and vias have currently reached a width or a diameter of approximately 0.1 µm and even less, with an aspect ratio of the vias of about 5 or more, the deposition of a barrier layer in a reliable manner on all surfaces of the vias and trenches and the subsequent filling thereof with copper substantially without voids is an extremely challenging issue in the fabrication of modern integrated circuits. Currently, the formation of a copper-based metallization layer is accomplished by patterning an appropriate dielectric layer and depositing the barrier layer, for example comprised of tantalum (Ta) and/or tantalum nitride (TaN), by advanced physical vapor deposition (PVD) techniques, such as sputter deposition. Thereafter, the copper is filled in the vias and trenches, wherein electroplating has proven to be a viable process technique, since it is capable of filling the vias and trenches with a high deposition rate, compared to CVD and PVD rates, in a so-called bottom-up regime, in which the openings are filled starting at the bottom in a substantially void-free manner. Generally, when electroplating a metal, an external electric field is applied between the surface to be plated and the plating solution. Since substrates for semiconductor production may be contacted at restricted areas, usually at the perimeter of the substrate, a conductive layer covering the substrate and the surfaces that are to receive a metal has to be provided. Although the barrier layer previously deposited over the patterned dielectric may act as a current distribution layer, it turns out, however, that, in view of crystallinity, uniformity and adhesion characteristics, preferably a so-called seed layer is to be used in the subsequent electroplating process to obtain copper trenches and vias having the required electrical and mechanical properties. The seed layer, for example comprised of copper, is typically applied by sputter deposition using substantially the same process tools as are employed for the deposition of the barrier layer, wherein these deposition techniques may provide the desired texture of the seed layer in combination with the previously deposited barrier material, thereby creating appropriate conditions for the subsequent filling in of the bulk metal.

For dimensions of 0.1 µm and less of vias in future device generations, the sputter deposition of extremely thin metal layers having a high degree of conformity as required for the barrier layer and the seed layer may become a limiting factor, since the step coverage characteristics of the above-described advanced sputter tools may not be further enhanced without significant modifications of these tools, which seems to not be a straightforward development. While the deposition of the barrier layer may be performed on the basis of other highly conformal techniques, such as atomic layer deposition (ALD), which is a well-controllable self-limiting CVD-like process, it appears that the characteristics of the seed layer may be difficult to obtain by these sophisticated techniques, while throughput may also be compromised, thereby making these techniques less attractive for the deposition of the seed material.

For dimensions of 0.1 µm and less of metal lines and vias in advanced semiconductor devices, the sputter deposition of extremely thin metal layers having a high degree of conformity as required for the barrier layer and the seed layer may represent critical process steps, since the step coverage characteristics of the above-described advanced sputter techniques may depend on the overall surface characteristics of the dielectric material, which in turn has to be patterned on the basis of highly sophisticated lithography and etch techniques. Even if other process techniques may be used in forming appropriate barrier materials or seed materials, for instance on the basis of extremely conformal deposition techniques, such as ALD, which is a well-controllable self-limiting CVD-like process, superior surface characteristics also have to be provided prior to the deposition of the barrier material and seed material. For example, deposition-related irregularities during the formation of the barrier material and the seed material may cause the creation of voids in the barrier material and possibly in the subsequently deposited copper metal, thereby deteriorating the electrical performance of the resulting interconnect structure, while also contributing to a reduced degree of reliability since premature failure of interconnect structure may be observed due to a reduced resistance against electromigration caused by voids and other interface irregularities in the barrier material and/or seed material. For this reason, great efforts are being made in appropriately preparing the surface of a patterned dielectric material prior to the deposition of the barrier material and the seed material.

On the other hand, it has been recognized that exposure of the barrier and seed material prior to actually depositing the copper bulk material may have a significant influence on the overall electrical performance of the metallization system, the reliability of the metallization system and also on the process results of process steps subsequent to the deposition of the barrier and seed material. For instance, in complex manufacturing environments as are typically encountered in semiconductor facilities for producing extremely complex semiconductor devices on the basis of mass production techniques, in sophisticated etch techniques, for instance for forming vias and trenches in the dielectric material, a plurality of surface contaminations may be generated, for instance in the form of organic etch byproducts and the like, which may require sophisticated cleaning recipes, for instance on the basis of wet chemical techniques and the like. Other possible sources of contamination may represent the dielectric material itself, which may typically contain a plurality of volatile components, which may increasingly diffuse out of the material, for instance by the corresponding openings created during the previous etch processes. These volatile components may themselves, or in combination with other components, result in inferior process conditions during the deposition of the barrier and seed materials, and may also significantly affect the sensitive material system prior to actually depositing the copper bulk material. That is, exposure to the clean room ambient after the deposition of the barrier and/or seed material may result in a more or less non-predictable interaction with the exposed surface areas, for instance by organic volatile components and the like, wherein the degree of surface modification may also depend on the queue time prior to the further deposition of the copper material. During the subsequent electrochemical deposition of the copper material, which itself represents a highly complex deposition process, typically performed on the basis of sophisticated deposition strategies and complex electrolyte baths, the deposition process may be influenced even by subtle variations of the seed material caused by the previous exposure to the manufacturing environment since, for instance, a delicate adjustment of the deposition rate in extremely narrow vias or trenches may be essential for obtaining appropriately filled metal regions. Moreover, even a subtle shift of the delicate balance of the deposition rates within tiny openings and wide openings or dielectric areas may result in an increased surface topography after completing the electrochemical deposition of the copper material, which may thus contribute to more critical process conditions during the subsequent removal of any excess material, for instance on the basis of CMP and the like.

Consequently, with the continuing shrinkage of the critical dimensions within sophisticated metallization layers, it becomes increasingly important not only to monitor the deposition processes for forming sophisticated barrier and/or seed material systems, but also to evaluate the influence of the manufacturing environment, i.e., the influence of queue time, the presence of specific contaminants and the like, on the barrier and/or seed materials prior to actually filling the vias and trenches with copper.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and test "vehicles" that enable an efficient evaluation and control of an ambient, also referred to as manufacturing environment, to which sensitive barrier/seed material systems may be exposed prior to depositing a sensitive material, such as copper, in complex metallization systems of semiconductor devices. The evaluation of at least some parameters that determine the manufacturing environment may be accomplished by providing specific test areas on dedicated test substrates or on product substrates on the basis of appropriately designed lithography masks, wherein test areas may comprise appropriate features that may provide a high degree of sensitivity for irregularities created during the formation of metal regions in a dielectric material of the metallization system. On the basis of these specific test areas, an evaluation of the manufacturing environment under consideration may be accomplished, for instance, on the basis of determining a defect rate and the like, so that an appropriate adjustment of the manufacturing environment may be achieved on the basis of the measurement results. In other illustrative aspects disclosed herein, a control of the manufacturing environment may be accomplished by varying at least one parameter value of the parameter setting that substantially determines the characteristics of the manufacturing environment under consideration, which may be accomplished by quantitatively determining a variation of at least one characteristic, such as a defect rate in relation to a specific value of the one or more environmental parameters under consideration. Thus, enhanced environmental conditions may be established for a specific sensitive material system, for instance comprising a conductive barrier material and/or seed material in the clean room ambient of a complex semiconductor production facility without requiring a detailed investigation of a plurality of degradation mechanisms caused by the variety of different components that may be present in the clean room ambient. Hence, even for a frequent change of the material systems to be provided prior to the deposition of the actual metallization metal, an efficient adaptation of the corresponding manufacturing environment may be accomplished, while, in other cases, even subtle variations of the manufacturing environment for a given process strategy may be detected and may be re-adjusted on the basis of the principles disclosed herein.

One illustrative method disclosed herein comprises forming a conductive layer on inner surface areas of a plurality of openings formed in a dielectric layer above a substrate of a semiconductor device, wherein the plurality of openings are formed in a specified test area of the substrate. The method further comprises exposing the substrate comprising the conductive layer to a manufacturing environment that is established on the basis of a specific parameter setting. The method further comprises forming a metal region in each of the plurality of openings of the substrate and determining a defect rate of the specified test area of the substrate. Additionally, the method comprises adjusting at least one parameter value of the specific parameter setting of the manufacturing environment on the basis of the defect rate obtained from the substrate.

A further illustrative method disclosed herein comprises forming a conductive layer on inner surface areas of a first plurality of openings formed in a first dielectric material and on inner surface areas of a second plurality of openings formed in a second dielectric material, wherein the first and second dielectric materials are formed above a first substrate and a second substrate, respectively. The method further comprises selectively exposing the first substrate to a specified environment established on the basis of a controllable parameter setting. Moreover, a metal region is formed in each of the first and second pluralities of openings and at least one characteristic parameter of the metal regions of the first and second substrates is determined. Additionally, the method comprises adjusting at least one parameter value of the controllable parameter setting on the basis of the at least one characteristic parameter.

One illustrative test system for monitoring a manufacturing environment for semiconductor production comprises a lithography mask comprising a test pattern to be formed in a dielectric material that is usable in a metallization layer of a semiconductor device. The test pattern comprises a plurality of test features, wherein a first subset of the test features has first dimensions that correspond to a minimum design area defined by design rules of the metallization layer. Furthermore, a second subset of the test features has second dimensions corresponding to dimensions that are less than the first minimum design area. Additionally, a third subset of the test features comprises lines with a minimum design width of the metallization layer.

BRIEF DESCRIPTION OF THE DRAWINGS

The disclosure may be understood by reference to the following description taken in conjunction with the accompanying drawings, in which like reference numerals identify like elements, and in which.

Figure 1A:
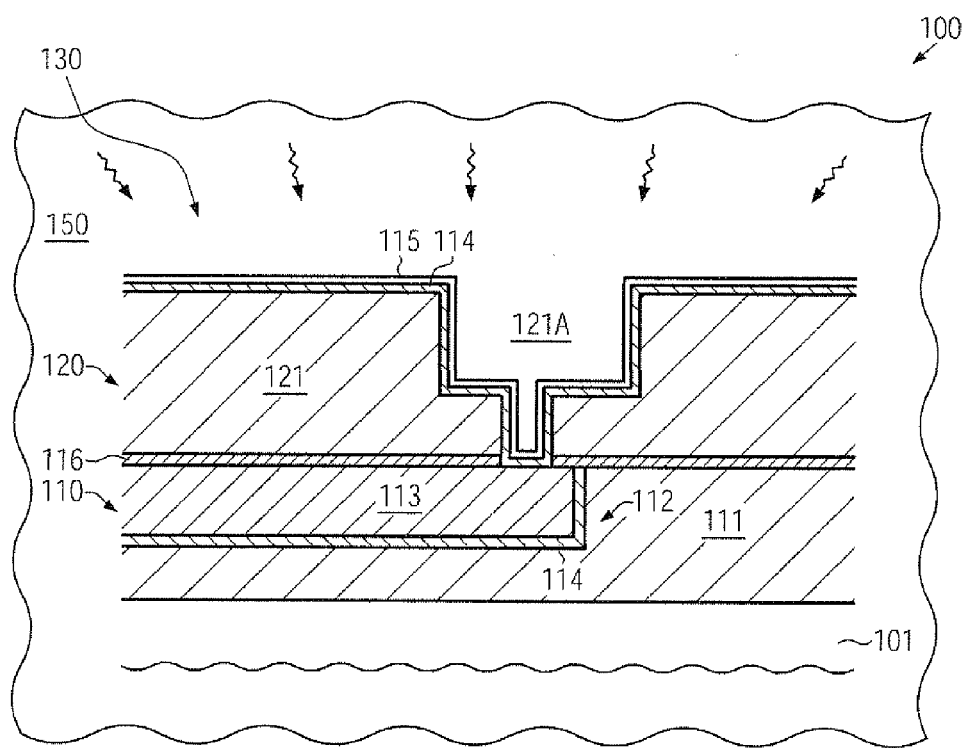
FIGS. 1a-1b schematically illustrate cross-sectional views of a semiconductor device during various manufacturing stages in forming a complex metallization layer on the basis of a conductive barrier material and/or seed material in combination with a copper-based fill material, wherein the semiconductor device may be exposed to a specified manufacturing ambient or environment after the deposition of the barrier/seed material.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and systems in which the influence of a manufacturing environment, that is, the clean room atmosphere, and a corresponding queue time or waiting time of substrates exposed to the manufacturing environment under consideration may be determined and monitored during the fabrication of complex metallization systems of semiconductor devices. It has been recognized that a manufacturing environment in complex semiconductor production facilities may include a plurality of components, such as oxygen, fluorine, volatile organic components and the like, which may have a significant influence on surface characteristics of sensitive material systems, such as the barrier and/or seed material used in combination with copper-based metallization systems. For instance, even if present in minute traces in the clean room ambient, nevertheless, a pronounced variability of the resulting copper-based metal regions may be observed, for instance when considering volatile organic components and the like. Similarly, in sensitive material systems, the exposure to oxygen may be critical for, for instance, sensitive materials such as copper, which may be used as a seed material, ruthenium, which may be used as a barrier and seed material, and the like. Consequently, by monitoring the manufacturing environment, i.e., the corresponding influences on the overall process result when forming complex metallization systems, an appropriate adaptation of the environment may be accomplished, while, in other cases, stable manufacturing conditions may be maintained for a given manufacturing strategy by controlling at least one parameter of the manufacturing environment.

FIG. 1a schematically illustrates a cross-sectional view of a semiconductor device 100 in a manufacturing stage in which a sophisticated barrier and/or seed layer material system may be formed and may be exposed to a manufacturing environment, for instance, prior to the deposition of the actual copper-based fill material. As illustrated, the semiconductor device 100 may comprise a substrate 101, which may represent any appropriate carrier material for forming therein and thereon circuit elements, such as transistors, capacitors and the like, as may be required for the overall configuration of the device 100. For instance, as previously explained, transistor elements having critical dimensions of approximately 50 nm and less may be formed in and above the substrate 101. Moreover, the semiconductor device 100 may comprise a metallization system 130, which may include a plurality of metallization layers 110, 120, wherein the number of individual metallization layers may depend on the overall complexity of the device 100. For convenience, only two metallization layers, i.e., the layers 110, 120, are illustrated in FIG. 1a.

The metallization layer 110 may comprise a dielectric material 111, such as a low-k dielectric material and the like, to enhance overall electrical performance of the metallization layer 110, as previously explained. Moreover, one or more metal regions, such as metal lines 112, may be formed in the dielectric material 111 and may comprise any appropriate core metal, such as copper, possibly in combination with other components, wherein a conductive barrier material 114 may separate the core material 113 from the surrounding dielectric material 111. As discussed above, the barrier material 114 may provide reliable confinement of the core metal 113 and may also provide a desired electromigration performance and mechanical stability, i.e., adhesion to the dielectric material 111. Moreover, as previously discussed, the barrier material 114 may also have an influence on grain size and grain orientation of the core metal 113. Moreover, the metallization layer 110 may comprise a cap layer or etch stop layer 116, such as a low-k dielectric material, such as a silicon carbide material, a nitrogen-enriched silicon carbide material and the like. It should be appreciated that the metal line 112 may also comprise a conductive cap layer in order to enhance overall electromigration behavior.

The metallization layer 120 comprises, in the manufacturing stage shown, a dielectric material 121, which may represent any appropriate material composition, such as a low-k material, an ultra low-k (ULK) material and the like. Furthermore, an opening 121A, such as a trench, possibly in combination with a via opening, may be formed in the dielectric material 121 so as to extend to the metal region 112 of the metallization layer 110. Furthermore, the barrier material 114 may be formed on the dielectric material 121 and on inner surface areas of the opening 121A. With respect to characteristics and composition of the barrier layer 114, the same criteria may apply as previously explained with reference to the material 114 of the layer 110. It should be appreciated that the barrier material 114 may comprise two or more different material compositions, such as tantalum nitride in combination with tantalum, which represents a frequently used barrier material system for copper-based metallization systems. It should be appreciated, however, that any other materials, such as ruthenium, titanium, titanium nitride, tungsten and many other materials, may be used as a barrier material, if compatible with the desired characteristics of the metallization system 130. Moreover, in the embodiment shown, a seed layer 115 may be formed on the barrier material 114, for instance in the form of a copper material, a copper alloy and the like. In other illustrative embodiments, the material system of the layers 114, 115 may act as a combined barrier and seed layer system, wherein the layer 115 may also provide barrier characteristics, such as enhanced adhesion, diffusion blocking effects and the like, while also acting as a material for initiating a subsequent electrochemical deposition of copper material. For example, in sophisticated applications, copper material may be directly deposited on a barrier/seed system on the basis of electrochemical deposition techniques, thereby avoiding a complex dedicated deposition of a specifically designed seed layer, such as a copper layer and the like. In other cases, materials such as ruthenium may act as a barrier material and a seed material during a subsequent electrochemical deposition process.

The semiconductor device 100 as illustrated in FIG. 1*a* may be formed on the basis of any appropriate manufacturing strategy which may include the deposition of the dielectric material 111 followed by the patterning thereof and forming the metal region 112, which may be accomplished on the basis of process techniques as will also be described with reference to the metallization layer 120. Hence, after forming the metal region 112 and providing the etch stop or cap layer 116, the dielectric material 121 may be formed by any appropriate deposition technique and within material composition in view of electrical performance, mechanical stability and the like. Next, sophisticated lithography techniques may be applied in order to form an appropriate etch mask, wherein, due to the high complexity of advanced semiconductor devices, typically, some mask features may be provided with minimum critical dimensions with respect to the patterning capabilities of process techniques used to form the metallization layer 120. For instance, the opening 121A, or at least a portion thereof, may represent a device feature of critical dimensions for the metallization layer 120, wherein compliance with corresponding design rules may significantly depend on a consistent and reliable realization of critical dimensions in the metallization layer 120 so that the associated lithography, etch, deposition and planarization techniques may have to be thoroughly controlled and monitored in order to provide the actual device features with minimum dimensions in a defect-free manner. Thereafter, the dielectric material 121 may be patterned so as to form the opening 121A, wherein, typically, a plurality of complex process atmospheres and chemical agents may have to be used, which may result in a certain degree of contamination of the clean room atmosphere of the corresponding production facility. Thereafter, the barrier layer 114 may be deposited by sophisticated physical vapor deposition, chemical vapor deposition and the like, followed by the deposition of the seed material 115, if required, which may also include sophisticated deposition techniques. It should be appreciated that a thickness of the barrier layer 114 and/or of the seed layer 115 may range from several nanometers to 20 or more nanometers in sophisticated applications, wherein a reliable coverage of inner sidewalls of the opening 121A may be required. For example, reliable confinement of copper material may necessitate a continuous coverage of any exposed surface areas of the dielectric material 121 within the opening 121A. Similarly, if a separate seed material may be required, a substantially continuous and uniform coverage of the barrier material 114 may be highly advantageous, since the seed layer 115 may initiate a chemical reaction and may act as a current distribution layer in an electroplating process so that the initial material deposition may critically depend on the characteristics of the seed layer 115. For instance, a non-continuous deposition of the seed layer 115 may result in a corresponding irregular initial material deposition, which may cause voids in the subsequent electroplating process. On the other hand, providing an increased thickness for one or both of the layers 114, 115 may also result in deposition irregularities during the subsequent electrochemical deposition, since, typically, overhangs may form at the top of narrow via openings and trenches, thereby also affecting the deposition characteristics of the subsequent electrochemical deposition.

In addition to the delicate manufacturing techniques for forming the layers 114 and/or 115 in the present disclosure, the influence of a manufacturing environment 150 on the exposed barrier/seed material system, such as the layers 114, 115, may be taken into consideration since the presence of a certain species, such as volatile organic components, oxygen and the like, may have an influence on the subsequent deposition of the copper bulk material and the further treatment thereof. Typically, it may be very difficult to assess the various individual contributions of the complex manufacturing environment 150, for instance in view of the many gaseous components, the pressure and the like, so that a predetermined set of parameters may be selected in order to provide stable process conditions. For example, temperature, humidity, pressure and the like may be considered as appropriate parameters for defining the manufacturing environment 150. Other parameters may be the degree of radiation, such as illumination of the environment 150, presence of specific organic compounds in the ambient air and the like. Furthermore, the queue time, i.e., the waiting time prior to the further processing of the semiconductor device 100, may also be referred to as a parameter for controlling the environment 150, which may have a significant influence on the process result since extremely tight queue time constraints may typically not be compatible with product scheduling in a complex semiconductor facility. Hence, typically, the queue time may have to be set on the basis of company internal constraints and with respect to the degree of material degradation caused by the influence of the environment 150.

Figure 1B:
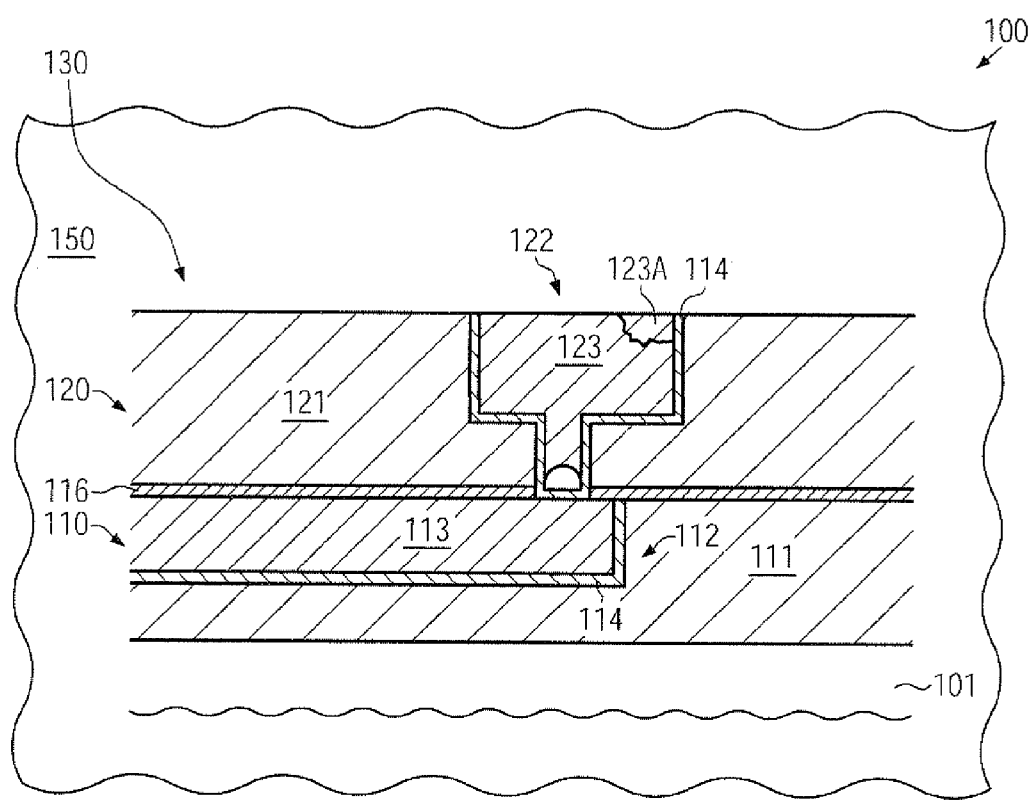

FIG. 1*b* schematically illustrates the semiconductor device 100 in a further advanced manufacturing stage in which a metal region 122 may be formed on the basis of the opening 121A and the material system 114, 115 (see FIG. 1*a*). In the embodiment shown, the barrier material 114 may separate a core metal 123, such as copper, from the surrounding dielectric material 121 when the seed layer 115 (FIG. 1*a*) may be provided in the form of a copper material. In other cases, a barrier/seed system may be provided, as previously explained. The semiconductor device 100 as illustrated in FIG. 1*b* may be formed by depositing the core material 123, for instance in the form of copper, by an electrochemical deposition process, such as electroless plating and/or electroplating, wherein the deposition behavior may depend on the surface characteristics of the previously formed layer system, as discussed above, which in turn may be influenced by the environment 150, wherein it should be appreciated that the environment 150 may change upon depositing the core metal 123. For example, after forming the barrier/seed metal system, the device 100 may have to be stored or transported in corresponding containers, as are typically used in sophisticated production facilities. Depending on the queue time, which in turn may depend on the availability of process tools, transport entities and the like, the device 100 may be positioned in the deposition reactor, which may also represent a portion of the manufacturing environment 150 that may have a different state compared to the environment established during transport and storage of the device 100. Thereafter, the material 123 may be deposited and may be subjected to further treatments, such as annealing and the like, followed by the removal of any excess material, for instance on the basis of CMP and the like. If required, further treatments, such as annealing and the like, may be performed after the CMP process. Consequently, due to the complexity of overall process sequence, the process results may depend on a plurality of factors, one of which may be represented by the manufacturing environment 150 interacting with the device 100 after the deposition of the barrier/seed material system and prior to and during the deposition of the core metal 123. Hence, a certain degree of variability may be observed and also a certain degree of defects 123A in the metal region 122 and/or on the dielectric material 121 may be observed.

According to the principles disclosed herein, the state of the manufacturing environment 150 may be monitored and evaluated and, in some illustrative embodiments, controlled on the basis of techniques, as will be described with reference to FIGS. 1c-1n.

Figure 1C:
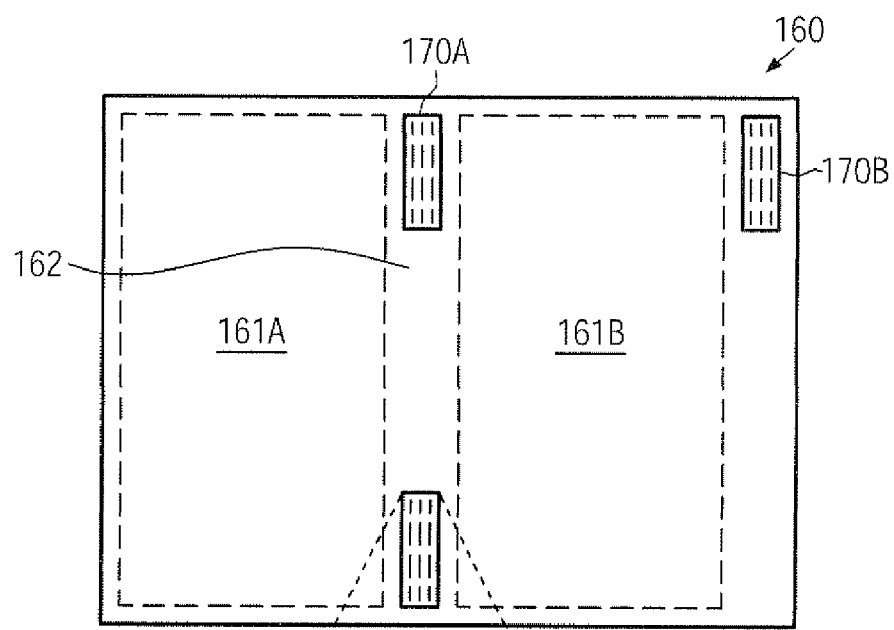
FIGS. 1c-1d schematically illustrate top views of a lithography mask, such as a reticle, including "chiplets" or areas for specified test features, according to illustrative embodiments.

FIG. 1c schematically illustrates a top view of a photo mask or reticle 160 which may comprise a plurality of patterned areas, also referred to as chiplets 170A, 170B, which may include test features for evaluating the process result of the above-described process sequence. For this purpose, the chiplets or test patterns 170A, 170B, may be positioned at any appropriate location within the reticle 160, for instance in regions 162 corresponding to scribe lines, which may separate patterned regions 161A, 161B that may correspond to product features to be imaged onto a specific device layer. In other cases, the chiplets or test patterns 170A, 170B may be positioned at any appropriate position, for instance when the reticle 160 may represent a dedicated test reticle for forming test sites on specific substrates and the like.

Figure 1D:
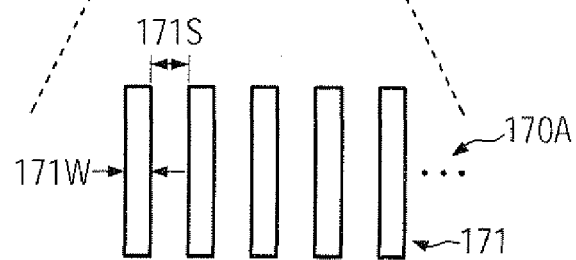
Figure 1D:
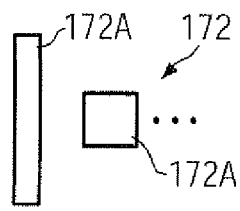
Figure 1D:
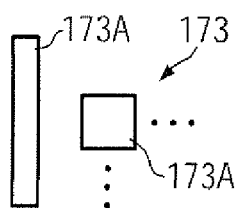

FIG. 1d schematically illustrates an enlarged view of one of the test patterns 170A, 170B. As illustrated, the test patterns 170A, 170B may comprise test features 171 in the form of lines corresponding to minimum critical dimensions, such as a line width 171W and a spacing 171S. It should be appreciated that corresponding minimum dimensions may depend on the design rule for a corresponding semiconductor device and thus for a specific device level, such as a metallization system of the semiconductor device under consideration. For instance, the width 171W and the spacing 171S may be approximately 100 nm and significantly less within an actual semiconductor device, wherein it should be appreciated that features 171 may represent mask features of a reticle so that the size thereof may be reduced according to a corresponding projection imaging system used in a photolithography tool.

The test pattern 170A may further comprise test features 172, which may represent geometric objects representing a minimum area that may be realized on the basis of the given design rules. For instance, rectangular objects may be provided with a minimum area 172A, wherein different "aspect" ratios, i.e., length to width, may be selected, such as a rectangle and a square. Similarly, the test pattern 170A may further comprise geometric objects representing an area, indicated as 173A, which may be less than a minimum area identified by the associated design rules.

Consequently, the test patterns or chiplets 170A, 170B may provide a high degree of sensitivity for manufacturing irregularities during the formation of a complex metallization system on the basis of a manufacturing sequence, as previously described above with reference to FIGS. 1a-1b. Hence, the corresponding test areas to be formed on product substrates or dedicated test substrates on the basis of the chiplets 170A, 170B of the reticle 160 may provide sensitive areas which may enable a quantitative evaluation of the process result, for instance on the basis of a corresponding defect rate, which may thus also correspond to an influence of the manufacturing environment, as will be described later on in more detail.

Figure 1E:
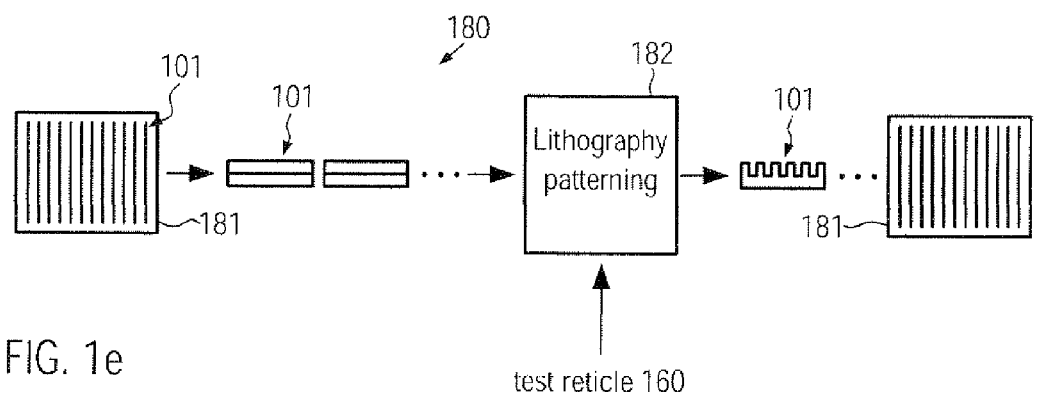
FIG. 1e schematically illustrates a manufacturing flow for preparing substrates for evaluating a manufacturing environment during the formation of sophisticated metallization layers, according to illustrative embodiments.

FIG. 1e schematically illustrates a first portion of a manufacturing sequence 180 for monitoring and evaluating a manufacturing environment, such as the environment 150 previously described with reference to FIG. 1a. As illustrated, a plurality of substrates, such as substrate 101 as described with reference to FIG. 1a, may be transported in a corresponding transport system and container, represented by 181, and may be subjected to a process sequence 182, for instance for imaging a desired pattern for a metallization system onto a resist mask by lithography and subsequently patterning a dielectric material on the basis of well-established etch strategies. For this purpose, the reticle 160, for instance representing a test reticle or a product reticle including the test patterns 170A, 170B may be used. After the patterning sequence, the substrate 101 may be transported and/or stored in the container 181, wherein it should be appreciated that different containers 181 may be used prior to and after and during the patterning sequence 182.

Figure 1F:
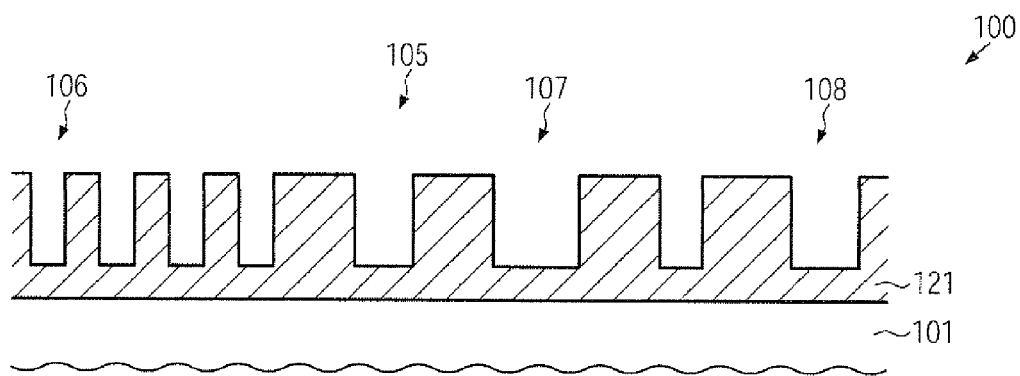
FIG. 1f schematically illustrates a cross-sectional view of a specific test area, according to illustrative embodiments.

FIG. 1f schematically illustrates the cross-sectional view of a device after the process sequence 182 of FIG. 1e, wherein, for convenience, it may be assumed that the device 100 previously described may comprise a dedicated test area 105 including the dielectric material for forming a metallization layer, such as the dielectric material 121, as previously described. Furthermore, test features 106, 107, 108 may be formed in the dielectric material 121, wherein these features may correspond to the test features 171, 172, 173, respectively, of the reticle 160 (FIGS. 1c-1d). The test features 106, 107, 108 may be formed on the basis of the same process techniques as previously described with reference to the metallization layer 120 of the device 100 of FIGS. 1a-1b.

Figure 1G:
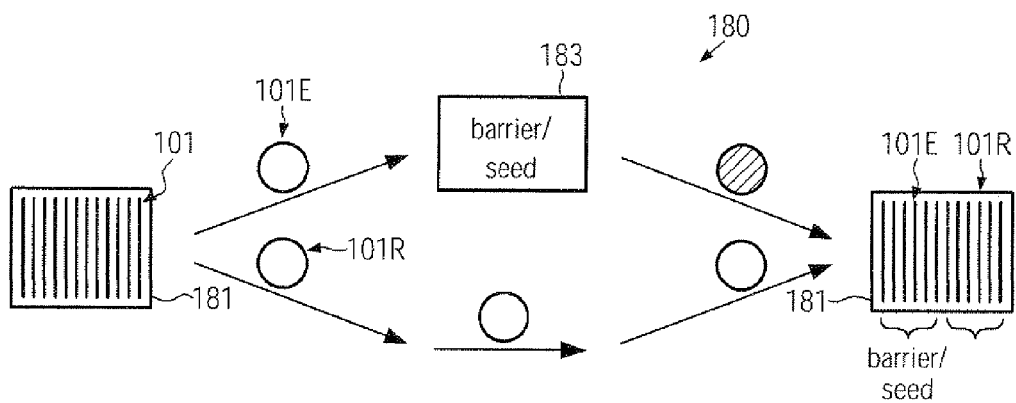
FIGS. 1g-1h schematically illustrate the manufacturing flow in a further advanced stage in which a barrier/seed material may be deposited above one or more dedicated substrates, according to illustrative embodiments.

FIG. 1g schematically illustrates a further portion of the process sequence 180. As illustrated, the patterned substrates 101, which may be provided by the transport container 181, may be supplied to one or more process tools for performing the complex deposition process, indicated as 183, for forming a barrier material and/or a seed material. In the embodiment shown, one or more of the substrates 101 may be selected as actual test or experimental substrates, indicated as 101E, whereas one or more of the substrates 101 may be selected as "reference" substrates, indicated as 101R. Moreover, the substrates 101E may receive a barrier and/or seed material during the process 183, which may include any appropriate deposition techniques, as previously explained. Thereafter, the substrates 101E, 101R may be treated commonly, for instance by gathering the substrates 101E, 101R in a corresponding transport container 181, or the substrates 101E, 101R may be separately treated.

Figure 1H:
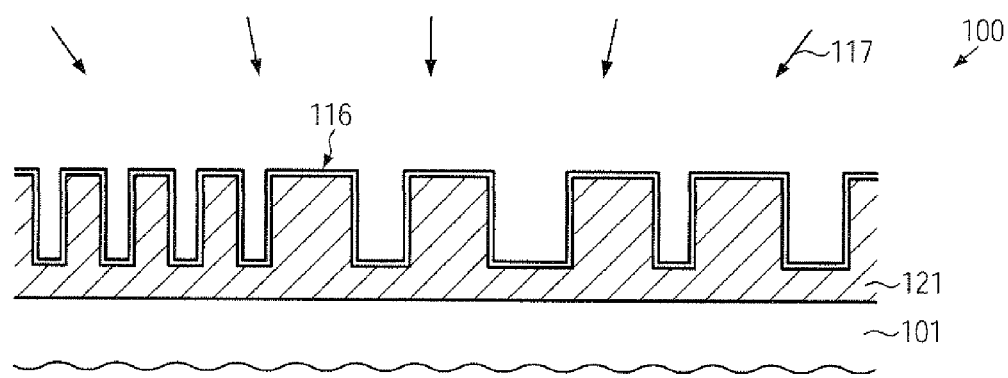

FIG. 1h schematically illustrates a cross-sectional view of the semiconductor device 100 corresponding to one or more substrates 101E. Thus, as illustrated, the device 100 may be exposed to one or more deposition processes 117 in order to form a material system 116, which may include a barrier material, a seed material and the like, as may be required for the subsequent deposition of a metal, such as copper, as previously explained. Thus, it should be appreciated that a conductive layer 116 may represent one or more barrier materials in combination with a seed material, if required, while in other cases a single material layer may be used as the conductive layer 116.

Figure 1I:
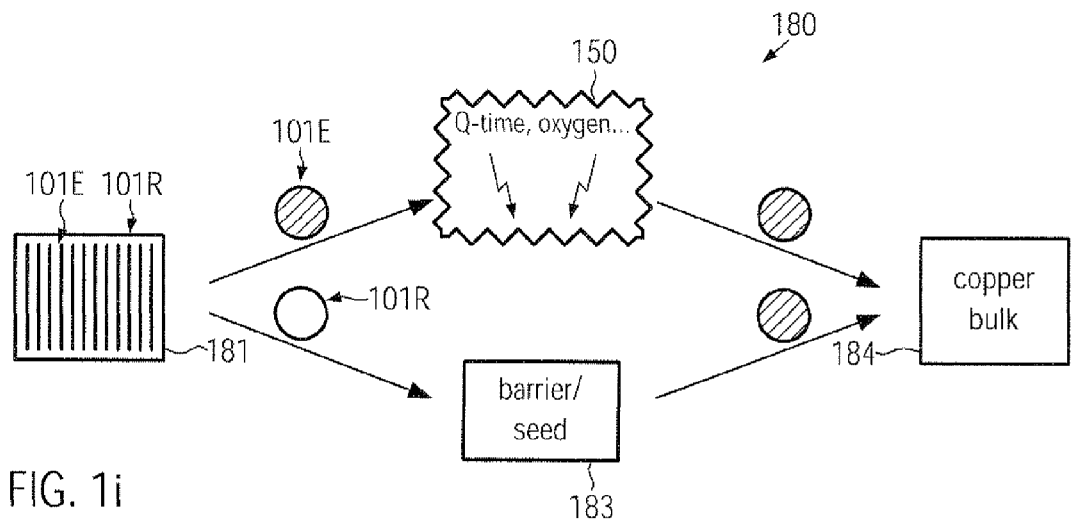
FIGS. 1i-1k schematically illustrate the manufacturing flow in a further advanced manufacturing stage in which at least some substrates having formed thereon the barrier/seed layer may be exposed to the manufacturing environment under consideration, according to still further illustrative embodiments.

FIG. 1*i* schematically illustrates the manufacturing flow 180 in a further advanced stage in which the substrates 101E may be exposed to the manufacturing environment 150 to be monitored and evaluated, wherein a complex interaction with the previously formed conductive layer 116 (FIG. 1*h*) may be initiated. It should be appreciated that the manufacturing environment 150 may represent the typical conditions encountered during volume production of complex semiconductor devices, including contact with several gaseous components, radiation and the like, and, in particular, a typical queue time range may also be applied in accordance with a typical scheduling in the environment 150. On the other hand, the substrates 101R may be processed on the basis of a deposition sequence 183, however, substantially without exposing the substrate 101R to the environment 150. For this purpose, the process tools of the sequence 183 may be made available for the substrate 101R without requiring pronounced waiting times and subsequently the substrates 101R may be further processed in order to receive the actual metallization metal on the basis of any appropriate deposition technique, such as electrochemical deposition. For example, while maintaining the substrates 101E within the manufacturing environment 150, the substrates 101R may be maintained without any further treatment until the substrates 101E are processed in the electrochemical deposition process 184. At this point in time, the substrate 101R may be processed according to the sequence 183 and may then immediately be processed according to the sequence 184. In this manner, a high degree of similarity of the overall process history of the substrate 101E, 101R with respect to transport containers, process tools and the like may be achieved. In other cases, the substrates 101E, 101R may be processed differently, for instance by giving the substrates 101R high priority after the processing in the sequence 183, while the substrates 101E may follow the typical scheduling.

Figure 1J:
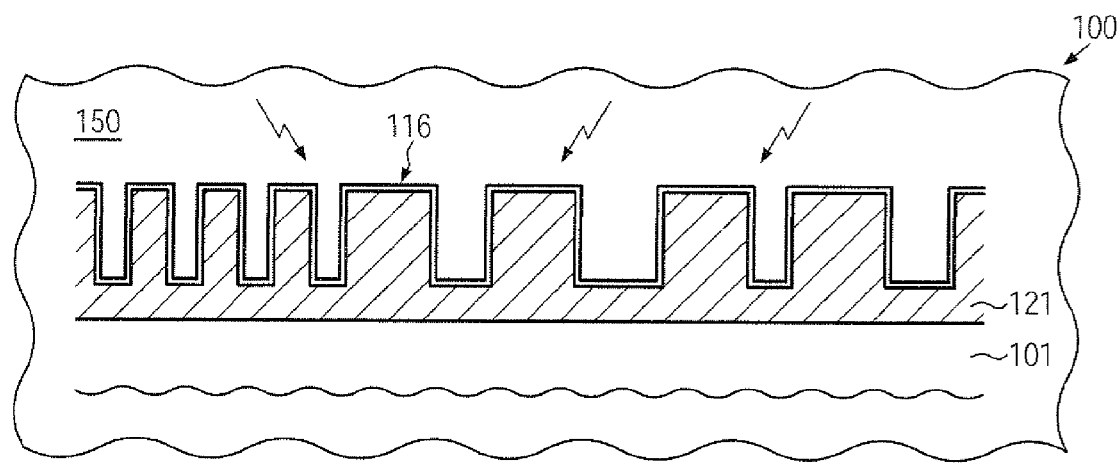

FIG. 1*j* schematically illustrates a cross-sectional view of the semiconductor device 100 corresponding to one of the substrates 101E. As illustrated, the conductive layer 116 may be exposed to the environment 150, thereby experiencing similar conditions as may be encountered during the usual scheduling in the semiconductor production facility.

Figure 1K:
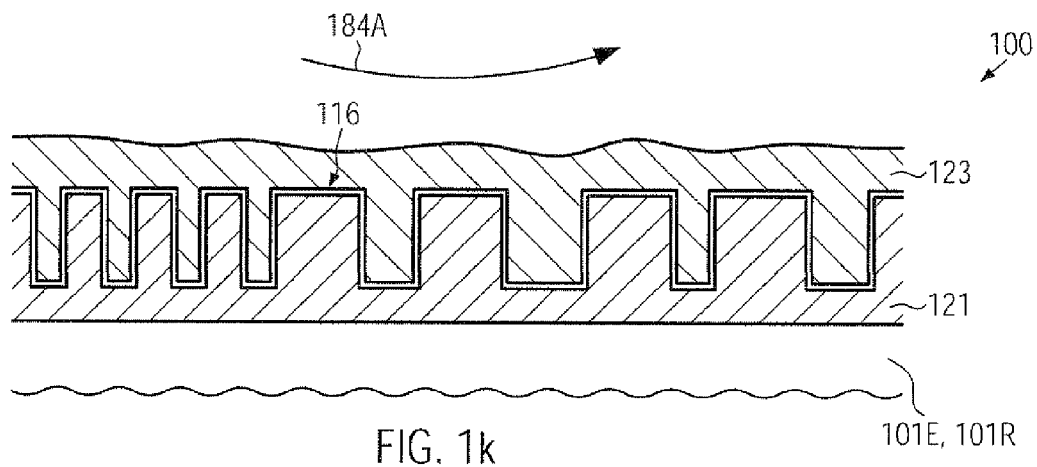

FIG. 1*k* schematically illustrates the semiconductor device 100 corresponding to substrates 101E or 101R during the manufacturing sequence 184. As illustrated, the core material 123 may be deposited, for instance by electrochemical deposition, and the device 100 may be subjected to a removal process 184A in order to remove any excess material of the metal 123 and of the conductive layer 116.

Figure 1L:
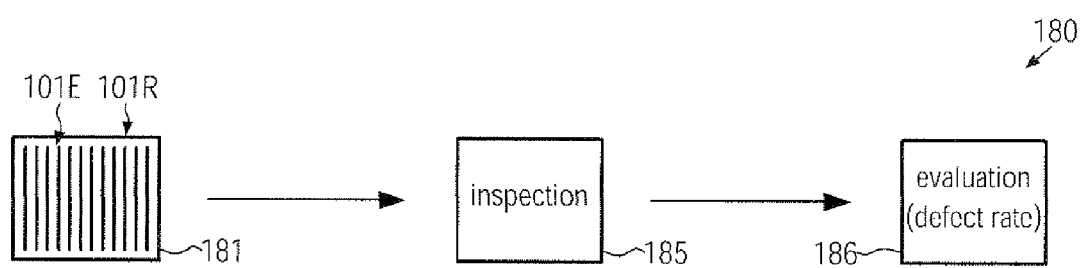
FIGS. 1l-1m schematically illustrate the evaluation of the influence of the manufacturing environment under consideration on the basis of determining a defect rate, according to illustrative embodiments.

FIG. 1*l* schematically illustrates the process sequence 180 in a further advanced stage. As shown, the substrates 101E, 101R comprising the metallization system previously formed may be subjected to an inspection in order to assess at least one characteristic of the metallization system previously formed in the corresponding test areas. For example, the inspection 185 may include any appropriate analysis technique, for instance optical inspection, in order to identify defects in the form of particles and the like, while, in other cases, in addition to or alternatively, other analysis techniques may be used, such as cross-sectional analysis, electron microscopy, x-ray analysis and the like. Consequently, a quantitative value of the process result corresponding to previous processes and the manufacturing environment may be obtained and may be evaluated, for instance by determining a defect rate, as indicated by 186.

Figure 1M:
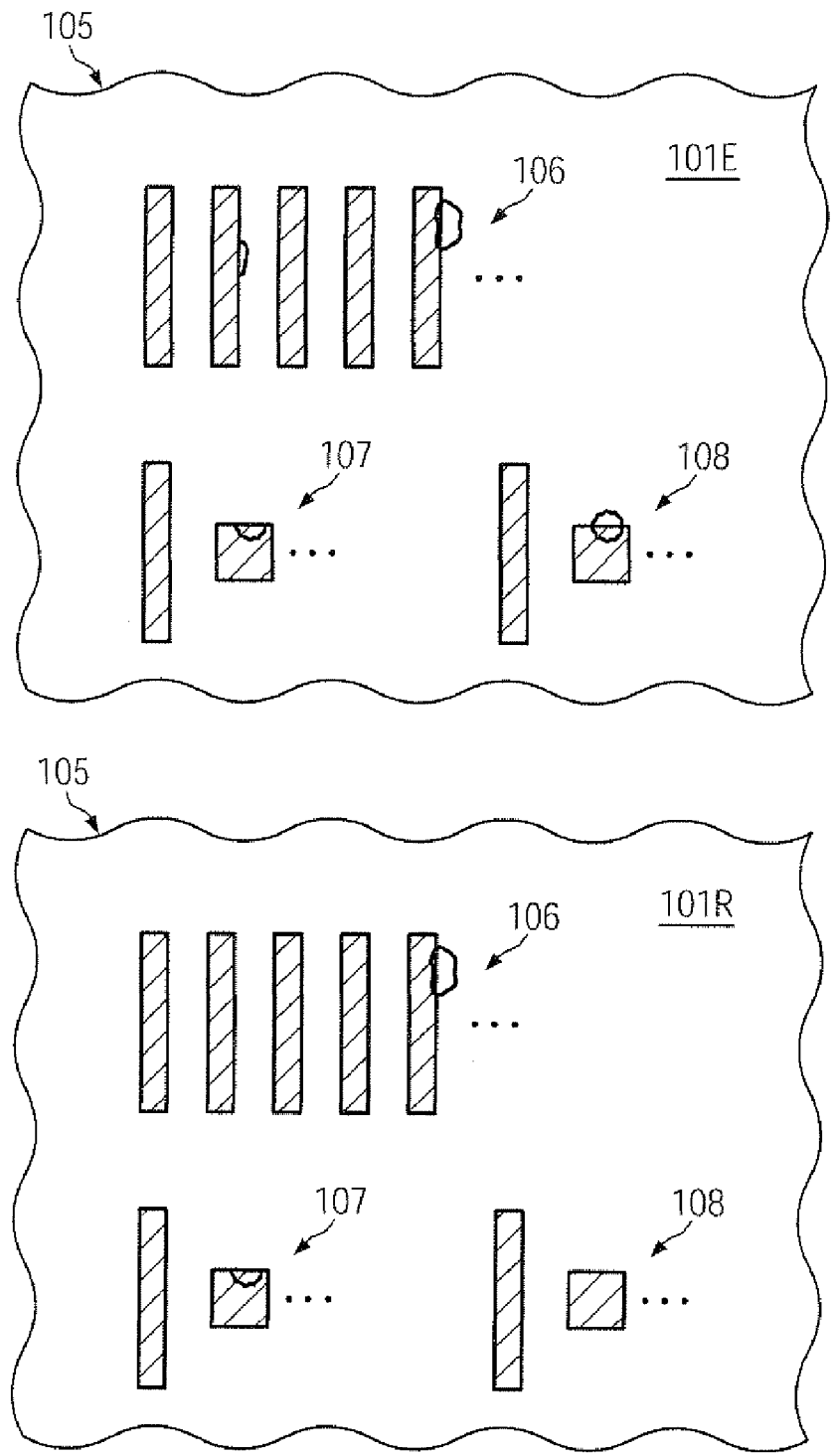

FIG. 1*m* schematically illustrates the top view of corresponding test areas 105 for one or more of the substrates 101E which have experienced the manufacturing environment to be evaluated, and for one or more of the substrates 101R which may act as reference substrates for assessing the influence of the manufacturing environment of interest. As previously explained, the test features 106, 107, 108 may provide a high degree of sensitivity with respect to any irregularities, since these features may be formed on the basis of the minimum critical dimensions and even beyond the critical dimensions, so that even very subtle variations in the overall process sequence may be reflected in one or more characteristics of the test features 106, 107, 108. For instance, an overall defect rate, for instance the number of defects in the form of particles and the like, as well as a lateral size thereof and the like, may be determined for one or more of the substrates 101E, thereby obtaining a value that characterizes the entire process history with respect to forming the features 106, 107, 108 for the substrates 101E. Similarly, a characteristic value, such as the defect rate, may be determined for one or more of the substrates 101R, which may thus represent a corresponding "offset" with respect to an influence of the manufacturing environment on the preceding test sequence for forming the test features 106, 107, 108. That is, since the substrates 101R may have substantially not been exposed to the manufacturing environment to be evaluated, the difference between the corresponding characteristic values, such as the defect rates, may be a quantitative indication of the influence of the manufacturing environment and thus of the one or more parameters determining the corresponding manufacturing environment. For example, the influence of the queue time prior to electrochemical deposition of the metallization metal may be correlated with characteristic values, for instance the defect rates, and an appropriate value for the queue time may be selected for otherwise predetermined parameters of the manufacturing environment under consideration. Similarly, a correlation with one or more other parameters, such as oxygen contents, temperature, humidity, pressure, illumination and the like, may be determined in order to obtain a quantitative indication for the various contributions of these parameters.

Figure 1N:
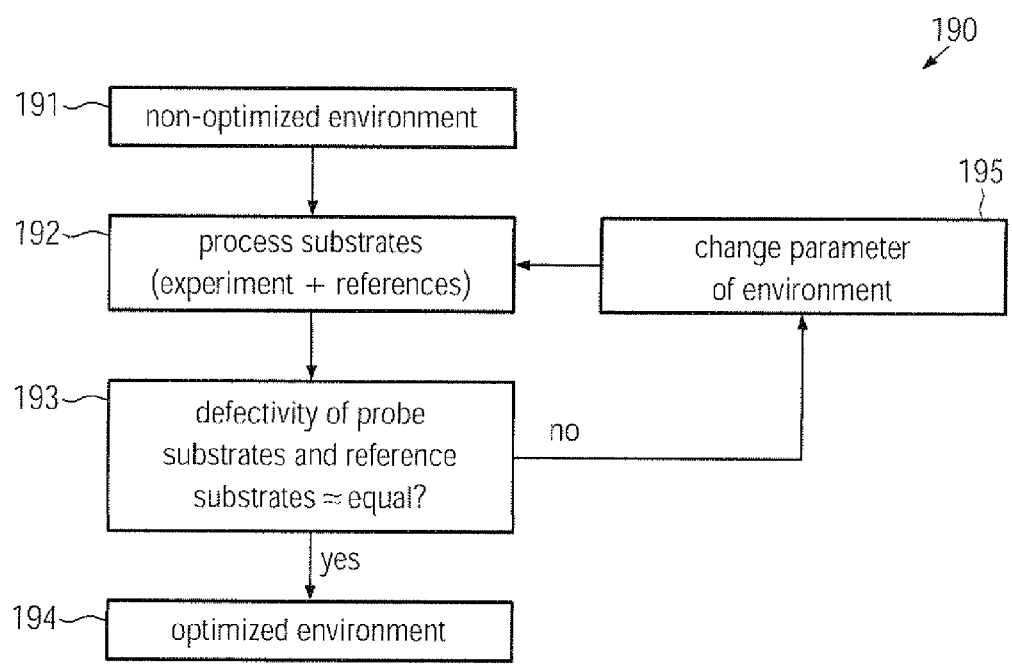
FIG. 1n schematically illustrates a method for controlling at least one parameter of a manufacturing environment during the formation of a complex metallization system, according to still further illustrative embodiments.

FIG. 1*n* schematically illustrates a control regime for adjusting at least one parameter of a manufacturing environment. The control strategy 190 may start by establishing a manufacturing environment, in step 191, which may be considered appropriate for performing volume production processes for forming a metallization system for a semiconductor device, as previously explained. In step 192, one or more test substrates and one or more reference substrates may be processed, wherein the reference substrates may not be substantially exposed to the environment under consideration, as is also previously explained. Thereafter, according to step 193, defectivity of the actual "probe" substrates and the reference substrates may be determined in order to determine a difference between the probe substrates and the reference substrates. As previously explained, the difference may thus represent a quantitative value for estimating influence of one or more parameters of the environment to be controlled. When the differences, for instance less than a predefined threshold, i.e., if the defect rates of the probe substrates and the reference substrates are comparable or substantially equal to each other, the influence of the environment to be controlled may be determined to be negligible and thus, in step 193, the environment may be assessed to be an "optimized" environment (step 194). When a significant difference may be determined in step 193, at least one parameter that controls the environment under consideration may be changed (step 195), for instance a queue time value may be changed, the oxygen contents may be changed, the contents of volatile organic components may be changed and the like, and a further set of probe substrates and reference substrates may be prepared according to step 192. The steps 193 and 195 may be repeated until a desired state of the environment of interest is achieved.

As a result, the present disclosure provides strategies and systems for evaluating the manufacturing environment during the formation of sensitive barrier/seed material systems by using an appropriate test pattern on the basis of a specifically designed lithography mask. On the basis of the test pattern, a dedicated test substrate or a product substrate may receive a test area, which may exhibit a high degree of sensitivity to variations in a manufacturing sequence and the corresponding environment. For example, the defect rate may be determined and may be correlated with one or more parameters that control the manufacturing environment of interest. For example, respective test substrates or product substrates having formed thereon a test pattern may be processed together with actual product substrates and may be analyzed with respect to a variability within the manufacturing sequence, which may be accomplished by adjusting one or more of the environmental parameters in order to maintain a corresponding characteristic value, such as the defect rate, within an allowable range. In other cases, a control of manufacturing environment may be accomplished by specifically evaluating the influence of the environment on the basis of reference substrates, which may "subtract" an offset that may not be substantially caused by the environment under consideration. In this manner, the overall contribution of the manufacturing environment and in more detail one or more parameters thereof may be quantitatively determined.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a conductive layer on inner surface areas of a plurality of openings formed in a dielectric layer above a first substrate of a semiconductor device, said plurality of openings formed in a specified test area of said first substrate;
   forming said conductive layer on inner surface areas of a plurality of openings formed in a dielectric layer above a second substrate of a semiconductor device, said plurality of openings of said second substrate formed in a specified test area of said second substrate;
   exposing said first substrate comprising said conductive layer to a manufacturing environment that is established on the basis of a specific parameter setting;
   forming a metal region in each of said plurality of openings of said first substrate;
   forming a metal region in each of said plurality of openings of said second substrate substantially without exposing said second substrate to said manufacturing environment;
   determining a defect rate of said specified test area of said first substrate; and
   adjusting at least one parameter value of said specific parameter setting of said manufacturing environment on the basis of said defect rate obtained from said first substrate.

2. The method of claim 1, wherein forming a metal region in each of said plurality of openings of said first substrate comprises electrochemically depositing a copper-containing material on said conductive layer and removing excess material of said copper-containing material by a planarization process.

3. The method of claim 1, wherein adjusting said at least one parameter value of said specific parameter setting comprises determining a defect rate of said specified test area of said second substrate and changing said at least one parameter value when a difference of said defect rates obtained from said first and second substrates is greater than a predefined threshold.

4. The method of claim 1, wherein said first substrate comprises a plurality of die regions and said specified test area is positioned in a scribe line of said first substrate.

5. The method of claim 1, wherein said first substrate is a dedicated test substrate comprising two or more of said specified test areas.

6. The method of claim 1, wherein forming said conductive layer comprises forming a barrier material that suppresses diffusion of copper atoms into said dielectric layer.

7. The method of claim 6, further comprising using said barrier material as a seed layer for directly forming thereon a copper-containing metal so as to fill said plurality of openings.

8. The method of claim 6, wherein forming said barrier material comprises depositing a first barrier material and a second barrier material.

9. The method of claim 6, further comprising forming a seed layer above said barrier material.

10. The method of claim 9, wherein said seed layer comprises copper.

11. The method of claim 1, further comprising forming a first subset of said plurality of openings on the basis of minimum design dimensions for a specified metallization layer of said semiconductor device.

12. The method of claim 11, further comprising forming a second subset of said plurality of openings on the basis of dimensions that are less than said minimum design dimensions of said specified metallization layer.

13. A method, comprising:
   forming a conductive layer on inner surface areas of a plurality of openings formed in a dielectric layer above a substrate of a semiconductor device, said plurality of openings formed in a specified test area of said substrate;
   exposing said substrate comprising said conductive layer to a manufacturing environment that is established on the basis of a specific parameter setting;
   forming a metal region in each of said plurality of openings of said substrate;
   determining a defect rate of said specified test area of said substrate; and
   adjusting at least one parameter value of said specific parameter setting of said manufacturing environment on the basis of said defect rate obtained from said substrate, wherein said specific parameter setting is selected so as to control at least one of an oxygen content, a content of volatile organic components and a queue time prior to forming said metal regions.

14. A test system for monitoring a manufacturing environment for semiconductor production, the test system comprising:

a lithography mask comprising a test pattern to be formed in a dielectric material usable in a metallization layer of a semiconductor device, said test pattern comprising a plurality of test features, a first subset of said test features having first dimensions that correspond to a minimum design area defined by design rules of said metallization layer, a second subset of said test features having second dimensions corresponding to dimensions that are less than said first minimum design area, and a third subset of said test features comprising lines with a minimum design width.

15. The test system of claim 14, wherein said minimum design width is approximately 100 nm or less.

* * * * *